US008420997B2

(12) United States Patent
Jung et al.

(10) Patent No.: US 8,420,997 B2
(45) Date of Patent: Apr. 16, 2013

(54) PHOTO-DETECTOR ARRAY

(75) Inventors: Edward K. Y. Jung, Bellevue, WA (US); Lowell L. Wood, Jr., Bellevue, WA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 769 days.

(21) Appl. No.: 12/290,632

(22) Filed: Oct. 30, 2008

(65) Prior Publication Data
US 2009/0134315 A1 May 28, 2009

Related U.S. Application Data

(63) Continuation-in-part of application No. 10/770,072, filed on Jan. 30, 2004.

(51) Int. Cl.
| | |
|---|---|
| H01L 31/00 | (2006.01) |
| H01L 27/00 | (2006.01) |
| H01J 40/14 | (2006.01) |
| G05F 1/10 | (2006.01) |
| H03D 3/24 | (2006.01) |

(52) U.S. Cl.
USPC .............. 250/214.1; 250/214 R; 250/208.1; 327/536; 375/374

(58) Field of Classification Search .............. 250/208.1, 250/214.1, 214 R; 348/308–312; 257/292; 331/14, 17, 18, 25; 327/100, 156, 536; 375/374, 375/376
See application file for complete search history.

(56) References Cited

U.S. PATENT DOCUMENTS

| | | | |
|---|---|---|---|
| 6,362,482 B1 | 3/2002 | Stettner et al. | |
| 6,380,571 B1 * | 4/2002 | Kalnitsky et al. | ............. 257/292 |
| 6,384,398 B1 | 5/2002 | Kalnitsky et al. | |
| 6,414,318 B1 | 7/2002 | Uber, III et al. | |
| 6,690,019 B2 | 2/2004 | Stettner et al. | |
| 2003/0029989 A1 | 2/2003 | Stettner et al. | |

OTHER PUBLICATIONS

Trakker Technologies, Inc.; Letter to Intellectual Ventures, LLC Aug. 14, 2005; Report of Potential Material Prior Art References for U.S. Pat App. No. 20050167572; pp. 1-11.
Saturation and Blooming; located at: http://www.roperscientific.de/theory.html; 2 pages: 71-72; printed on Jan. 29, 2004.
MPP; located at: http://www.roperscientific.de./theory.html; 3 pages: 72-74; printed on Jan. 29, 2004.

* cited by examiner

*Primary Examiner* — Georgia Y Epps
*Assistant Examiner* — Don Williams

(57) ABSTRACT

A system accountably maintains an accumulated charge of a photo-detector charge well at or around a predefined level.

34 Claims, 1 Drawing Sheet

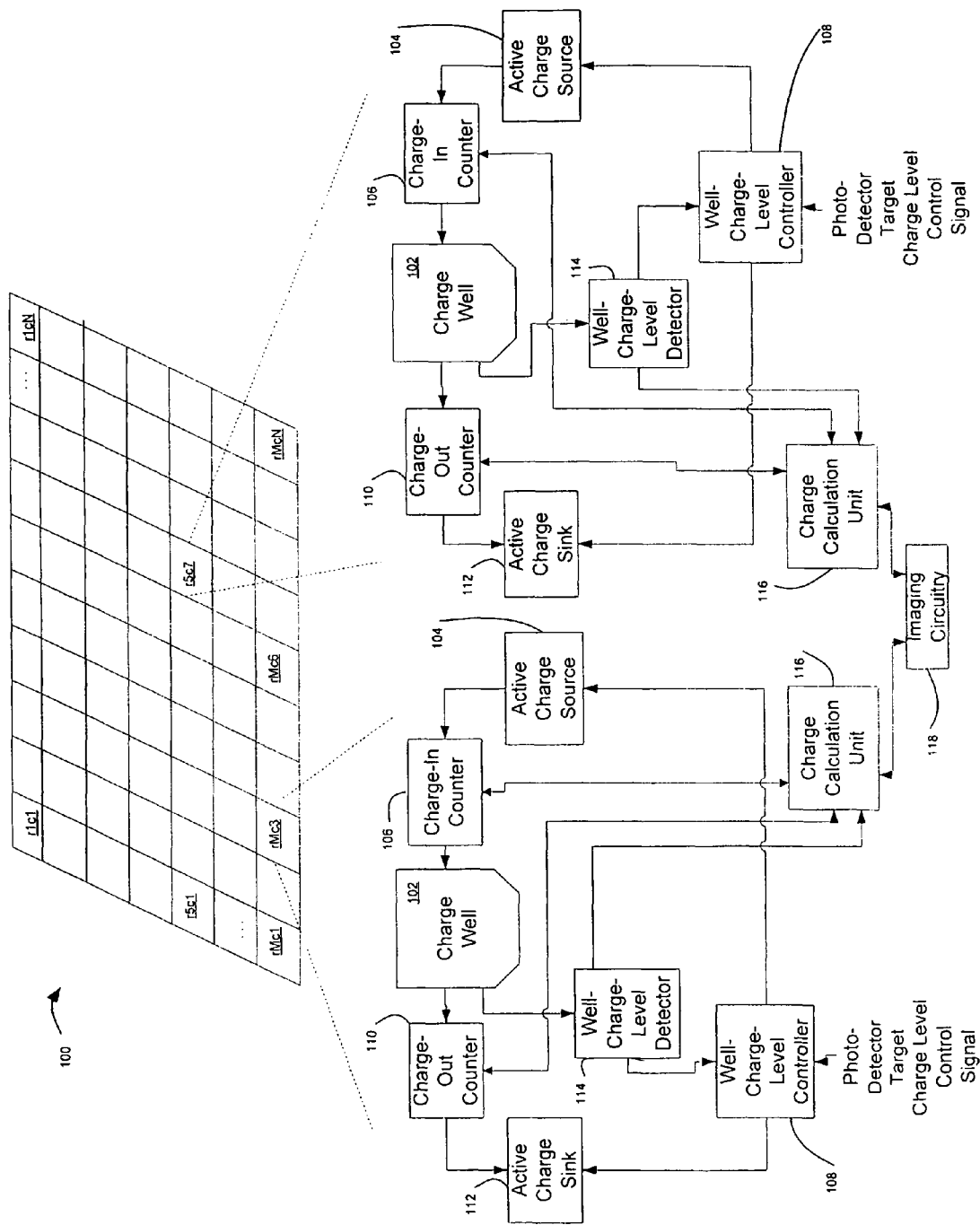

PHOTO-DETECTOR ARRAY

RELATED APPLICATIONS

For purposes of the USPTO extra-statutory requirements, the present application constitutes a continuation-in-part of U.S. patent application Ser. No. 10/770,072, entitled Photo-Detector Array with Charge Pump and Charge Counter, naming Edward K.Y. Jung and Lowell L. Wood, Jr. as inventors, filed 30 Jan. 2004, which is currently co-pending, or is an application of which a currently co-pending application is entitled to the benefit of the filing date.

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

TECHNICAL FIELD

The present application relates, in general, to photo-detection.

SUMMARY

In one aspect, a system includes but is not limited to: a photo-detector array having a first charge well; a first charge pump operably coupled with the first charge well; and a first charge counter operably coupled with said first charge pump. In addition to the foregoing, other system aspects are described in the claims, drawings, and text forming a part of the present application.

In one aspect, a method includes but is not limited to: counting charges moved between a first charge pump and a first charge well of a photo-detector array; and calculating an overall charge-level of the first charge well in response to said counting. In addition to the foregoing, other method aspects are described in the claims, drawings, and text forming a part of the present application.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In addition to the foregoing, various other method and/or system aspects are set forth and described in the text (e.g., claims and/or detailed description) and/or drawings of the present application.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined by the claims, will become apparent in the detailed description set forth herein.

BRIEF DESCRIPTION OF THE FIGURES

FIG. 1 shows a partial view illustrative of various exemplary photo-detector array device(s) and/or process(es).

The use of the same symbols in different drawings typically indicates similar or identical items.

DETAILED DESCRIPTION

The present application uses formal outline headings for clarity of presentation. However, it is to be understood that the outline headings are for presentation purposes, and that different types of subject matter may be discussed throughout the application (e.g., device(s)/structure(s) may be described under the process(es)/operations heading(s) and/or process(es)/operations may be discussed under structure(s)/process(es) headings). Hence, the use of the formal outline headings is not intended to be in any way limiting.

I. Sensitive Photo-Detector Array Device(s) and/or Process(es)

With reference now to FIG. 1, shown is a partial view illustrative of various exemplary photo-detector array device(s) and/or process(es). Accordingly, the present application first describes certain specific exemplary structures of FIG. 1; thereafter, the present application illustrates certain specific exemplary processes. Those having ordinary skill in the art will appreciate that the specific devices and processes described herein are intended as merely illustrative of their more general counterparts.

A. Structure(s) and/or Device(s)

Photo-detector array 100 is depicted as having individual photo-detectors arranged in M×N row-column format. Photo-detector array 100 is shown indexed with notation indicative of this row and column format (e.g., the photo-detectors of row 1, column 1; row M, column 1; and row M, column N are respectively shown as indexed r1c1; rMc1; and rMcN). Those having skill in the art will appreciate that photo-detector array 100 is intended to be representative of substantially any suitable type of photo-detector array (e.g., charge coupled device (CCD), complimentary oxide semiconductor (CMOS), or other type photo-detector arrays) arranged in substantially any suitable architecture consistent with the teachings herein.

Continuing to refer to FIG. 1, exemplary implementations of photo-detectors rMc3 and r5c7 are illustrated in breakout views. Those skilled in the art will appreciate that photo-detectors conventionally convert impinging photons to representative charge, with such representative charge thereafter being accumulated in what may be referred to as "charge wells" or "pixel wells." Conventional aspects of such detection and conversion are not addressed herein for clarity of presentation, but those skilled in the art will recognize that there is typically a known relationship between photons impinging on a surface of a particular photo-detector (e.g., photo-detector rMc3 or r5c7) and charge accumulated in the charge or pixel well of that particular photo-detector (e.g. 8 impinging photons are known to typically generate 4 accumulated electrons).

Referring now to photo-detector rMc3, charge well 102 is shown as coupled to an output of charge-in counter 106 (e.g., a coulomb counter or an electron charge counter). An input of charge-in counter 106 is depicted as coupled to an output of active charge source 104 (e.g., an electron source). A control signal input of active charge source 104 is illustrated as coupled with a control signal output of well-charge-level controller 108.

Charge well 102 is further shown as coupled to an input of charge-out counter 110 (e.g., a coulomb counter or an electron charge counter). An output of charge-out counter 110 is depicted as coupled to an input of active charge sink 112 (e.g., an electron sink). A control signal input of active charge sink 112 is illustrated as coupled with a control signal output of well-charge-level controller 108.

Well-charge-level controller 108 is shown as coupled to an output of well-charge-level detector 114. Well-charge-level detector 114 is depicted as coupled to charge well 102 Well-charge-level controller 108 is further shown as having a photo-detector target charge level control signal.

Well-charge-level detector 114 is further illustrated as having an output coupled to charge calculation unit 116. In one exemplary implementation, well-charge-level detector 114 includes a processor configured by a program; in another exemplary implementation, well-charge-level detector 114 includes circuitry relatively constantly configured to execute logic.

Imaging circuitry 118 is shown receiving input from charge calculation unit 116. In one exemplary implementation, imaging circuitry 118 is conventional and usually receives input similar to that normally output by an individual photo detector or a photo detector array (e.g., for backwards compatibility with existing technologies). In another exemplary implementation, imaging circuitry 118 is specially constructed to interface with logic of charge calculation unit 116.

With reference now to photo-detector r5c7, shown connected in like fashion as for photo-detector rMc3 are charge-in counter 106, active charge source 104, well-charge-level controller 108, charge-out counter 110, active charge sink 112, and well-charge-level detector 114. Those having skill in the art will appreciate that exhaustive recitation of photo-detector r5c7's component connections is not necessary in light of the herein-described connections of like components of photo-detector rMc3.

Certain of the described structures of FIG. 1 may serve as environments wherein certain processes can be illustrated, as set forth herein.

B. Operation(s) and/or Process(es)

Those having ordinary skill in the art will appreciate that there will typically be a predefined charge level for charge well 102 of photo-detector rMc3 such that photo-detector rMc3 will display near-optimal responsiveness to impinging photons. In one exemplary process, well-charge-level controller 108 more or less continuously adjusts the control signal inputs of active charge source 104 and/or active charge sink 112 such that detected accumulated charge level in charge well 102 stays at or around the predefined charge level where responsiveness is near-optimal. In one exemplary implementation, well-charge-level controller 108 entails a processor configured to control either or both active charge source 104 and active charge sink 112 utilizing at least one of a proportional, integral, and derivative control scheme. Other exemplary implementations are described elsewhere herein.

Well-charge-level controller 108 typically gains knowledge of the detected accumulated charge level of charge well 102 from an output of well-charge-level detector 114. Well-charge-level detector 114 relatively continuously senses the level of charge in charge well 102 and generates the output indicative of that charge in a form appropriate to well-charge-level controller 108. In addition, well-charge-level detector 114 relatively continuously senses the level of charge in charge well 102 and generates an output indicative of the level of charge in charge well 102 in a form appropriate to charge calculation unit 116.

Charge calculation unit 116 receives the signal indicative of the level of charge in charge well 102 from the Output of well-charge-level detector 114. In addition, charge calculation unit 116 receives input from and controls either or both charge-in counter 106 and charge-out counter 110. Charge-in counter 106 counts charge sourced into charge well 102 by active charge source 104 over some interval of time under the control of charge calculation unit 116. Charge out counter 110 counts charge sunk out of charge well 102 by active charge sink 112 over some interval of time under the control of charge calculation unit 116. In one exemplary implementation, charge calculation unit 116 entails a processor configured to control either or both charge-in counter 106 and charge-out counter 110. Other exemplary implementations are described elsewhere herein.

For any particular interval of time, charge calculation unit 116 uses (a) knowledge of the level of charge in charge well 102 at the beginning and/or end of the time interval (obtained from well-charge-level detector 114), (b) knowledge of charge sourced to charge well 102 during the time interval (obtained from charge-in counter 106), and/or (c) knowledge of charge sunk from charge well 102 during the time interval (obtained from charge-out counter 110) to calculate an aggregate photo-induced charge received by charge well 102 during the particular time interval. Thereafter, charge calculation unit 116 uses the calculated aggregate photo-induced charge and a recalled known relationship between charge received by charge well 102 and photons impinging on the surface of photo-detector rMc3 to calculate a likely number of impinging photons responsible for the calculated aggregate photo-induced charge (which can serve as an indication of local intensity at that photo-detector), Thereafter, charge calculation unit 116 generates and transmits to imaging circuitry 118 a signal indicative of the calculated likely number of photons impinging within the reference time interval, where the signal is in a form appropriate to imaging circuitry 118 (e.g., a defined amount of charge in implementations where imaging circuitry 118 is implemented using conventional imaging circuitry that ordinarily receives packets of charge, or a logical signal in implementations where imaging circuitry 118 is implemented in computation logic circuitry). Thereafter, imaging circuitry 118 processes the information indicative of the number of photons impinging on the rMc3 photo-detector over the reference time interval.

Those having skill in the art will appreciate that the process just described in the context of photo-detector rMc3 can also be implemented in the context of any other like photo-detectors present, such as photo-detector r5c7.

C. Benefit(s), Variation(s), and/or Implementation(s)

As shown herein, the inventors have devised a number of technologies, examples of which are illustrated in the text and drawings of the present application. In one illustrated technology, the aggregate charge contained within a charge well of a photo-detector array is manipulated such that the aggregate charge in the charge well is more or less maintained within defined bounds (e.g., at or around a charge level where the photo-detector associated with the charge well has good sensitivity). In various implementations, the manipulation of the aggregate charge is achieved by actively sourcing/sinking charges to/from the charge well. In various implementations, counts of the sourced/sunk charges are used to extrapolate an aggregate charge of the charge well. A benefit of some of the herein described implementations is that, since aggregate charge in a charge well of a photo-detector array is more or less maintained within defined bounds, the dynamic range of the charge well of the photo-detector array can be increased well beyond that possible in the absence of the maintenance of such aggregate charge.

Those having skill in the art will recognize that the present application teaches modifications of the devices, structures, and/or processes within the spirit of the teaching herein. For example, in one alternate exemplary implementation of photo-detector rMc3, charge-in counter and active charge source 104 are omitted, and the charge level of charge well 102 is controlled through the active sinking of a known quantity of current. Other modifications of the subject matter herein will be appreciated by one of ordinary skill in the art in light of the teachings herein.

The foregoing detailed description has set forth various embodiments of the devices and/or processes via the use of block diagrams, flowcharts, and examples. Insofar as such block diagrams, flowcharts, and examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware running on one or more processors, or as virtually any combination thereof, and that designing the circuitry and/or writing the code for the software and or firmware would be well within the skill of one skilled in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by various types of electromechanical systems having a wide range of hardware, software, firmware, or virtually any combination thereof. Consequently, as used herein electromechanical includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., any of the various forms of random access memory), electrical circuitry forming a communications device (e.g., a modem, communications switch, or optical-electrical equipment), and any non-electrical analog thereto, such as optical or other analogous devices.

Those skilled in the art will recognize that it is common within the art to describe devices and/or processes in the fashion set forth herein, and thereafter use standard engineering practices to integrate such described devices and/or processes into image processing systems. That is, at least a portion of the devices and/or processes described herein can be integrated into an image processing system via a reasonable amount of experimentation. Those having skill in the art will recognize that a typical image processing system generally includes one or more of a system unit housing, a video display device, a memory sub-system such as volatile or non-volatile memory, processors such as microprocessors and digital signal processors, computational entities such as operating systems, drivers, and applications programs, one or more human interaction devices, such as a touch pad or screen, control systems including feedback loops and control motors (e.g., feedback for sensing lens position and/or velocity; control motors for moving/distorting lenses to give desired image-focal properties. A typical image processing system may be implemented utilizing any suitable commercially available components, such as those typically found in digital still camera systems and/or digital motion camera systems.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or implementing components (e.g., implementing components). Likewise, any two components so associated can also be viewed as being "operably connected" or "operably coupled" to each other to achieve the desired functionality.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A system comprising:
   a photo-detector array having at least one charge well;
   at least one charge pump operably coupled with the at least one charge well, the at least one charge pump including at least one active charge sink;
   a well-charge-level controller operably coupled with said at least one charge pump, said well-charge-level controller configured to provide at least one control signal to the at least one active charge sink to control an operation of the at least one active charge sink to substantially continuously maintain a charge level in the at least one charge well at a target charge level; and
   at least one charge counter operably coupled with said at least one charge pump.

2. The system of claim 1, wherein said at least one active charge sink of said at least one charge pump comprises:
   an active charge sink controllable using at least one of a proportional, integral, or derivative control scheme.

3. The system of claim 1, wherein said at least one charge pump further comprises:
   an active charge source.

4. The system of claim 1, wherein said well-charge-level controller operably coupled with said at least one charge pump, said well-charge-level controller configured to provide at least one control signal to the at least one active charge sink to control an operation of the at least one active charge sink to substantially continuously maintain a charge level in the at least one charge well at a target charge level comprises:
   a well-charge-level controller configured to provide at least one control signal to the at least one active charge sink to control an operation of the at least one active charge sink to substantially continuously maintain a charge level in the at least one charge well at a charge level associated with a responsiveness to impinging photons.

5. The system of claim 4, wherein said well-charge-level controller configured to substantially continuously maintain a charge level in the at least one charge well at a charge level associated with a responsiveness to impinging photons further comprises:
   a well-charge-level controller configured to substantially continuously maintain a charge level in the at least one charge well at a charge level associated with a near-optimal responsiveness of a photo-detector.

6. The system of claim 1, wherein said well-charge-level controller operably coupled with said at least one charge pump, said well-charge-level controller configured to provide at least one control signal to the at least one active charge sink to control an operation of the at least one active charge sink to substantially continuously maintain a charge level in the at least one charge well at a target charge level comprises:
   a processor configured to control said at least one charge pump utilizing at least one of a proportional, integral, or derivative control.

7. The system of claim 6, wherein said processor configured to control said at least one charge pump utilizing at least one of a proportional, integral, and/or derivative control further comprises:
   a photo-detector target charge level control signal input.

8. The system of claim 1, wherein said at least one charge counter operably coupled with said at least one charge pump further comprises:
   a charge calculation unit operably coupled with said at least one charge counter.

9. The system of claim 8, wherein said charge calculation unit operably coupled with said at least one charge counter further comprises:
   a processor configured to determine a charge-level of the at least one charge well in response to a count of said at least one charge counter.

10. The system of claim 9, wherein said processor configured to determine a charge-level of the at least one charge well in response to a count of said at least one charge counter further comprises:
    said processor configured to determine a photo-induced charge-level of the at least one charge well in response to a count of said at least one charge counter.

11. The system of claim 9, wherein said processor configured to determine a charge-level of the at least one charge well in response to a count of said at least one charge counter further comprises:
    said processor configured to determine a difference in charge-level of the at least one charge well in response to a count of said at least one charge counter.

12. The system of claim 9, wherein said processor configured to determine a charge-level of the at least one charge well in response to a count of said at least one charge counter further comprises:

said processor configured to determine a measure indicative of at least one impinging photon associated with a photo-induced charge of said at least one charge well.

13. The system of claim 8, wherein said charge calculation unit operably coupled with said at least one charge counter further comprises:
imaging circuitry operably coupled with said charge calculation unit.

14. The system of claim 1, further comprising:
a well-charge-level detector operably coupled with said well-charge-level controller and said at least one charge well.

15. The system of claim 1, further comprising:
said well-charge-level controller operably coupled with a charge calculation unit and said at least one charge well.

16. A system, comprising:
a charge counter operable to count charges moved between at least one charge pump and at least one charge well of a photo-detector array while maintaining a charge level of the at least one charge well of the photo-detector array, the at least one charge pump including at least one active charge sink operable to receive at least one control signal to controllably adjust the charge level; and
a charge level calculator operable to calculate an overall charge-level of the at least one charge well in response to said counting and a time interval.

17. The system of claim 16, wherein said charge counter operable to count charges moved between at least one charge pump and at least one charge well of a photo-detector array, the at least one charge pump including at least one active charge sink operable to receive at least one control signal to controllably adjust the charge level comprises:
a charge counter operable to count a number of charges sunk from the at least one charge well using the at least one active charge sink operable to receive at least one control signal to controllably adjust the charge level of the at least one charge well of the photo-detector array.

18. The system of claim 16, wherein said charge counter operable to count charges moved between at least one charge pump and at least one charge well of a photo-detector array, the at least one charge pump including at least one active charge sink operable to receive at least one control signal to controllably adjust the charge level comprises:
a monitoring component operable to monitor the charge level of the at least one charge well; and
a control component operable to control an operation of the at least one active charge sink responsive to said monitoring component.

19. The method of claim 18, wherein said control component operable to control an operation of the at least one active charge sink responsive to said monitoring component comprises:
a comparing component operable to compare a monitored charge level of the at least one charge well against a reference charge level; and
a control component operable to control an operation of the at least one active charge sink responsive to said comparing component.

20. The system of claim 19, wherein:
(a) said comparing component operable to compare a monitored charge-level of the at least one charge well against a reference charge level includes:
(i) a comparing component operable to compare the monitored charge-level of the at least one charge well against a photo-detector target charge level; and
(b) said control component operable to control an operation of the active charge sink responsive to said comparing component includes:
(i) a control component operable to control an operation of the active charge sink to dynamically maintain the charge-level of the at least one charge well at or near a photo-detector target charge level, responsive to said comparing component.

21. The system of claim 20, wherein said comparing component operable to compare the monitored charge-level of the at least one charge well against a photo-detector target charge level further comprises:
a comparing component operable to compare the monitored charge-level of the at least one charge well against a charge level associated with a near-optimal responsiveness of a photo-detector.

22. The system of claim 20, wherein said comparing component operable to compare the monitored charge-level of the at least one charge well against a photo-detector target charge level further comprises:
a comparing component operable to compare the monitored charge-level of the at least one charge well against a charge level associated with a responsiveness of a photo-detector.

23. The system of claim 19, wherein said comparing component includes at least one of a charge calculation unit or a well-charge-level controller.

24. The system of claim 18, wherein said monitoring component includes at least one of a well-charge-level detector, a charge-in counter, a charge-out counter, or a charge calculation unit.

25. The system of claim 18, wherein said control component includes a well-charge-level controller.

26. The method of claim 16, wherein said charge counter operable to count charges moved between at least one charge pump and at least one charge well of a photo-detector array, the at least one charge pump including at least one active charge sink operable to receive at least one control signal to controllably adjust the charge level comprises:
a charge counter operable to count a number of charges sunk from the at least one charge well by the at least one active charge sink.

27. The system of claim 16, wherein said charge counter operable to count charges moved between at least one charge pump and at least one charge well of a photo-detector array, the at least one charge pump including at least one active charge sink operable to receive at least one control signal to controllably adjust the charge level comprises:
a monitoring component operable to monitor the charge level of the at least one charge well; and
a control component operable to control an operation of an active charge source in response to said monitoring component.

28. The system of claim 27, wherein said control component operable to control an operation of an active charge source in response to said monitoring component comprises:
a comparing component operable to compare a monitored charge-level of the at least one charge well against a reference charge level; and
a control component operable to control an operation of the active charge source responsive to said means for comparing.

29. The system of claim 28, wherein:
(a) said comparing component operable to compare a monitored charge-level of the at least one charge well against a reference charge level includes:

(i) a comparing component operable to compare the monitored charge-level of the at least one charge well against a photo-detector target charge level; and
(b) said control component operable to control an operation of the active charge source responsive to said comparing component includes:
(i) a control component operable to control an operation of the active charge source to dynamically maintain the charge-level of the at least one charge well at or near a photo-detector target charge level, responsive to said comparing component.

30. The system of claim 29, wherein said comparing component operable to compare the monitored charge-level of the at least one charge well against a photo-detector target charge level comprises:
a comparing component operable to compare the monitored charge-level of the at least one charge well against a charge level associated with a near-optimal responsiveness of a photo-detector.

31. The system of claim 29, wherein said comparing component operable to compare the monitored charge-level of the at least one charge well against a photo-detector target charge level comprises:
a comparing component operable to compare the monitored charge-level of the at least one charge well against a charge level associated with a responsiveness of a photo-detector.

32. The system of claim 16, wherein said charge level calculator operable to calculate an overall charge-level of the at least one charge well in response to said counting and a time interval further comprises:
a charge level calculator operable to calculate the overall charge-level of the at least one charge well responsive to said charge counter operable to count and a monitored charge-level of the at least one charge well.

33. The system of claim 16, wherein said charge level calculator operable to calculate an overall charge-level of the at least one charge well in response to said counting and a time interval further comprises:
a charge level calculator operable to calculate the overall charge-level of the at least one charge well in response to said counting, the time interval, and a monitored charge-level of the at least one charge well.

34. The system of claim 16, wherein said charge level calculator operable to calculate an overall charge-level of the at least one charge well in response to said counting and a time interval further comprises:
a charge level calculator operable to calculate a measure indicative of at least one impinging photon associated with a photo-induced charge of said at least one charge well.

* * * * *